United States Patent [19]

Jambotkar

[11] 4,099,987

[45] Jul. 11, 1978

[54] FABRICATING INTEGRATED CIRCUITS INCORPORATING HIGH-PERFORMANCE BIPOLAR TRANSISTORS

[75] Inventor: Chakrapani Gajanan Jambotkar, Hopewell Junction, N.Y.

[73] Assignee: International Business Machines Corporation, Armonk, N.Y.

[21] Appl. No.: 818,640

[22] Filed: Jul. 25, 1977

[51] Int. Cl.$^2$ ............................ H01L 21/265; H01L 7/54
[52] U.S. Cl. ............................................. 148/1.5; 357/56; 357/91
[58] Field of Search ....................... 357/56, 50, 36, 34; 156/643; 148/1.5

[56] References Cited

U.S. PATENT DOCUMENTS

| | | | |
|---|---|---|---|
| 3,677,837 | 7/1972 | Ashar | 148/175 |
| 3,853,644 | 12/1974 | Tarui et al. | 148/175 |
| 4,000,506 | 12/1976 | Hirai et al. | 357/34 |
| 4,028,140 | 6/1977 | Summers et al. | 148/1.5 |
| 4,045,249 | 8/1977 | Hotta | 148/1.5 |
| 4,047,975 | 9/1977 | Widman | 148/1.5 |

OTHER PUBLICATIONS

R. H. Dennard et al., "Controlling Process for Fabricating Short-Channel FET Device", IBM-TDB, 18, (1976), 2743.

J. A. Archer, "Improved Microwave Transmission Structure", Elect. Letts., 8, (1972), 499.

J. A. Archer, "Low–Noise Implanted Base Microwave Transistors", Solid State Electr., 17, (1974), 387.

*Primary Examiner*—L. Dewayne Rutledge
*Assistant Examiner*—Upendra Roy
*Attorney, Agent, or Firm*—George O. Saile

[57] ABSTRACT

A method and resulting semiconductor device which utilizes a mesa emitter structure in a silicon body. The mesa emitter is formed in the silicon semiconductor body and then passivated on its sidewalls using a suitable dielectric. The base region is formed both under the mesa emitter and adjacent thereto. The emitter-base junction is substantially in one plane and substantially without a sidewall component. Contacts are provided to the emitter and to the base region surrounding the mesa emitter. The resulting structure is such that a base contact can be within a few thousand angstroms of the intrinsic base region.

26 Claims, 13 Drawing Figures

FABRICATING INTEGRATED CIRCUITS INCORPORATING HIGH-PERFORMANCE BIPOLAR TRANSISTORS

BACKGROUND OF THE INVENTION

The invention relates to semiconductor bipolar devices which may be advantageously utilized in high performance bipolar integrated circuits.

DESCRIPTION OF THE PRIOR ART

The importance of integrated circuits which are based upon a bipolar technology in digital and analog applications is well known. Besides bipolar transistors, Schottky barrier diodes and diffused resistors are the usual integrated circuit components provided by a bipolar technology. The bipolar transistors may be of either NPN or PNP type. Unless, however, a "complementary" bipolar technology is sought wherein transistors of both NPN and PNP type are used, transistors of the NPN type are usually preferred to the PNP type. This is because of the superior frequency characteristic of an NPN transistor compared to a PNP transistor which is facilitated by the higher electron mobility vis-a-vis hole mobility.

Conventionally, integrated circuits composed of NPN bipolar transistors, diffused resistors and Schottky barrier diodes are formed on a P type silicon substrate. In the conventional NPN transistor structure, the N+ type emitter is surrounded by a P type base and the base is surrounded by an N− type collector. Further, there usually exists a buried N+ region beneath the base as part of the collector, its purpose being to minimize collector series resistance. An insulating layer, commonly of silicon dioxide, is present on the surface of the silicon substrate. Holes are formed in this insulating film for the purpose of making metal contacts to the emitter, base and collector regions. In the usual method of fabricating integrated circuits, the N− type collectors are formed through epitaxial growth of an N− doped continuous silicon film on the P type substrate. In general, however, the transistor components of an integrated circuit must have isolated collectors. This isolation is commonly achieved through either P type "isolation" regions by themselves or P type isolation regions in combination with silicon dioxide walls which extend from the silicon surface to the P type isolation. This conventional structure of an integrated NPN transistor has been described in many publications. One of these publications is: "Integrated Circuits: Design Principles and Fabrication," Textbook prepared by the Engineering Staff, Motorola, Inc., Semiconductor Products Division; in particular, Chapters 5, 7 and 10–15, published by McGraw-Hill Book Company, New York, N.Y. 1965.

In a large number of integrated circuit applications, the two important transistor characteristics are the current gain, $\beta$, and the gain bandwidth frequency, $f_t$. Maximization of these two quantities is highly desirable. In addition, minimization of base resistance without sacrificing either current gain or gain bandwidth frequency is also usually highly desirable.

In the prior art, maximization of current gain and gain bandwidth frequency is sought, among other means, through minimization of transistor's "intrinsic" basewidth, that is, the width of the base region directly beneath the emitter. The "intrinsic" base resistance, of course, undesirably increases in this process. The intrinsic base resistance is then attempted to be reduced as much as possible by keeping the horizontal emitter width to the minimum value allowed by the photolithographic state-of-the-art. In the transistors of the prior art, the base resistance also has an equally significant "extrinsic" component; it results from the relatively large distance between the location of the base metal contact and the edge of the intrinsic base region. This relatively large distance is once again undesirably dictated by the photolithographic considerations.

As indicated above, the intrinsic basewidth of transistors is attempted to be reduced to the extent allowed by the diffusion or ion implantation processing state-of-the-art. However, in the transistors of the prior art, a portion of electrons injected by the emitter in the forward bias condition of the emitter base junction have to travel a large distance in the extrinsic base region before they can reach the base collector junction. This adversely affects both current gain and gain bandwidth frequency of the transistors. There is another undesirable consequence of the presence of the extrinsic base region surrounding the emitter in transistors of the prior art, that is the existence of the emitter base sidewall junction capacitance. All these adverse effects are attempted to be minimized through minimization of the emitter base junction depth allowed by the state-of-the-art of diffusion or ion implantation and contact metallization processing. Also, a trade-off of emitter efficiency, and hence current gain, has to be taken into account in designing the emitter base junction depth of transistors of the prior art.

SUMMARY OF THE PRESENT INVENTION

A process is described for fabricating bipolar integrated circuits which are of a very high performance. The process involves the formation of a buried collector in a substrate of opposite conductivity type, formation of an epitaxial collector followed by formation of a mesa emitter in the epitaxial body. The mesa can be formed typically by reactive ion etching of portions of the surface of the silicon body. A second method for forming the mesa emitter is through the use of localized epitaxial growth of monocrystalline silicon to the desired thickness above the silicon body. The base region is preferably formed after the formation of the emitter region by using a blockout mask for preferably two ion implantation steps. A blockout mask is usually a dimensionally noncritical photoresist mask used to cover up certain portions on the surface of the silicon body. The first ion implantation step forms the extrinsic base region using a high dosage and low energy. The extrinsic base region is that portion of the base region surrounding the mesa emitter. The second ion implantation step is used to form the intrinsic base region using a relatively low dose and relatively high energy. The intrinsic base region is that portion of the base region directly underneath the emitter and that portion of the base which forms the emitter base junction. Contacts are then formed to the emitter and extrinsic base region as well as the collector and the substrate. In an alternative process, the buried collector is first formed in a substrate of opposite conductivity type. An epitaxial base of the same conductivity type as the substrate is then formed followed by formation of a mesa emitter either through reactive ion etching of portions of the silicon body or through localized epitaxial growth of monocrystalline silicon to the desired thickness above the silicon body. The base is electrically separated from the substrate of the same conductivity by dielectric isolation. Contacts are formed to the emitter, base, collector and substrate.

The structure resulting from the aforementioned process is a high performance bipolar semiconductor device which is very useful as a part of an integrated circuit. The mesa emitter in the semiconductor body extends above the surface of the body. Passivation with a suitable dielectric material covers the side portions of the mesa. The base region extends below the mesa and to the surrounding areas around the mesa region. The emitter base junction is substantially in one plane, that is, substantially without a sidewall component. Electrical contacts are made to the emitter and to the region of the base surrounding the mesa emitter as well as the collector and the substrate.

DESCRIPTION OF THE PREFERRED EMBODIMENT

Figure 1:
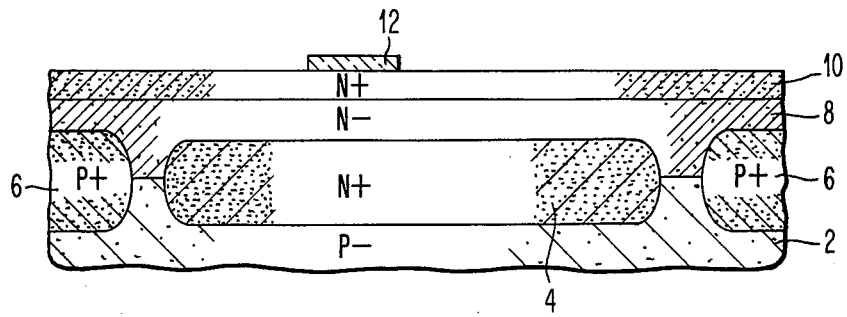
FIGS. 1-6 illustrate one method for forming the bipolar semiconductor device of the present invention.

Referring now to the drawings and in particular to FIG. 1, there is shown a semiconductor body 2 of a P-conductivity type. The semiconductor body is typically silicon and of a resistivity of the order of 10–20 ohm-cm corresponding to a doping level of $7 \times 10^{14} - 2 \times 10^{15}$ atoms/cc. A thin layer of silicon dioxide (not shown), typically 3500 A in thickness is grown on the top surface of the P- body 2. Conventional photolithography and etching techniques are utilized to form a suitable silicon dioxide mask for the subcollector diffusion step. N type impurities are then diffused by conventional techniques to form a region having a surface concentration level of typically $5 \times 10^{20}$ atoms/cc. The N type impurity may be, for example, arsenic or phosphorus.

The structure is now subjected to a thermal oxidation wherein silicon dioxide (not shown) is grown to, for example, 4800A. Simultaneously with the growth of the silicon dioxide, the N type impurity is driven further into the semiconductor body.

The silicon dioxide is now used as another diffusion mask using conventional photolithography and etching techniques. The body is now subjected to diffusion of a P type impurity, such as boron, preferably of a high concentration level such as $3 \times 10^{20}$ atoms/cc at the surface of the exposed silicon regions.

All silicon dioxide on the surface of the silicon body 2 is removed by use of conventional etching techniques. The silicon body is then placed in an epitaxial growth chamber and a monocrystalline silicon layer 8 is grown upon the silicon body. This growth may be done by conventional techniques such as the use of SiCl$_4$/H2 or SiH$_4$/H2 mixtures at growth temperatures of about 1000° C to 1200° C. The thickness of the epitaxial layer is typically 2 micrometers but may be in the range of 1 to 10 micrometers. During the epitaxial growth, the monocrystalline silicon body 8 is doped with an N type impurity of a low concentration level which is typically $2 \times 10^{16}$ atoms/cc. During the epitaxial growth, the N+ and P+ diffused regions in the substrate 2 move into the epitaxial growth to form the N+ region 4 and the P+ region 6. The N+ region 4 is the subcollector region and the P+ region 6 forms a portion of the isolation region facilitating electrical separation of transistors.

A blanket N type high concentration impurity 10 is diffused in the surface of the epitaxial layer 8 and driven in in an inert atmosphere at an elevated temperature of about 1000° C. The surface concentration of this layer 10 is typically $5 \times 10^{20}$ atoms/cc. A thermally grown silicon dioxide layer 12 is then formed in a thickness of, for example, 2000A on the surface of this impurity layer 10. The impurity layer 10 is further driven in during this heat cycle. Standard photolithography and etching techniques are used to form a suitable mask in the silicon dioxide layer 12. In the case of the present embodiment, the remaining silicon dioxide layer 12 mask is in the area where the mesa emitter is to be formed. The structure of the silicon body at this stage of processing is shown in FIG. 1.

Figure 2:
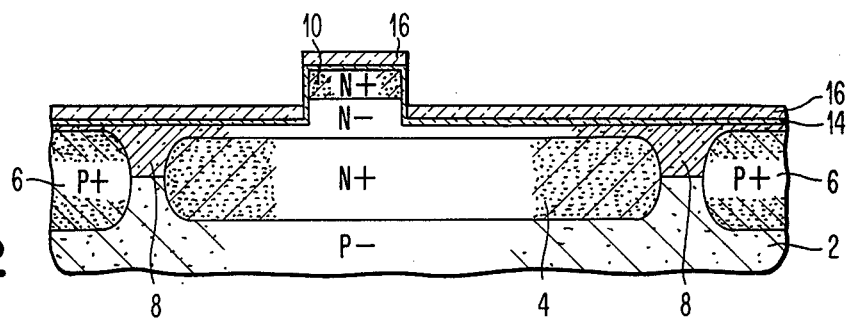
Figure 8:
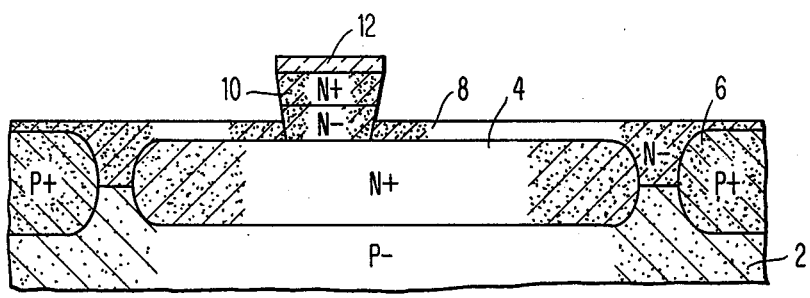
FIG. 8 shows a preferred mesa emitter structure.

Using the mask 12, the silicon body is placed in a reactive ion etching plasma. Details of this reactive ion etching of silicon may be understood more fully by reference to the J. N. Harvilchuck et al. patent application ser. no. 594,418, filed July 9, 1975, now abandoned, entitled "Reactive Ion Etching of Silicon" and assigned to the assignee of the present patent application. Briefly, the process involves providing the mask layer 12 which is described typically as silicon dioxide, silicon nitride, or aluminum oxide wherein the RF induced plasma is reactive chlorine, bromine, or iodine species as specified in the Harvilchuck et al. patent application. The precise description of the RF glow discharge apparatus is given in the beforementioned patent application. The reactive ion etch or plasma ambient is preferably a combination of an inert gas such as argon and a chlorine specie. Application of suitable power in the order of about 20 to 200 watts from RF voltage source will produce sufficient power density to cause the reactive ion etching operation to be carried out in less than an hour. The result of this operation is the removal of portions of layer 8 and 10 to produce a mesa as shown in FIG. 2. The depth of the etch produces the desired height of mesa emitter. This desired height is between about 5000 to 12000 Angstroms. The sidewalls of the mesa are substantially vertical or even as preferred with a slight slope of between about 80° to 85° as shown in FIG. 8.

All silicon dioxide is now removed by use of a suitable etchant. The silicon body is placed in a thermal oxide growing ambient of typically dry oxygen at 970° C to produce a silicon dioxide layer 14 of about 150 Angstroms in thickness. A layer of silicon nitride 16 of, for example, 800 Angstroms in thickness is deposited over the layer 14. The technique of RF sputtering of silicon nitride is used for this silicon nitride deposition. This is significant to insure the desired discontinuity of the silicon nitride layer along the sidewalls of the silicon mesas. It can be seen from FIG. 2 that the layer 16 covers the top of mesa and the surrounding areas but not the sides of the mesa. The slight slope in FIG. 8 assures that the mesa's sidewalls are not covered. As an alternative to the silicon nitride layer 16, a layer of a refractory metal such as molybdenum about of 1500 A in thickness is used. When deposited, the large height of the mesa insures the desired discontinuity of the metal film at the mesa sidewalls. If necessary, a quick dip etch in a suitable etchant may be exercised in the case of either the silicon nitride or the refractory metal to further insure the said desirable film discontinuity at the mesa sidewalls.

Figure 3:
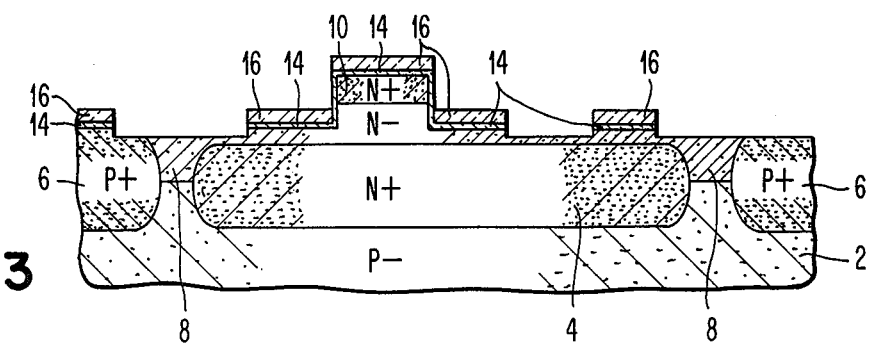
Figure 4:
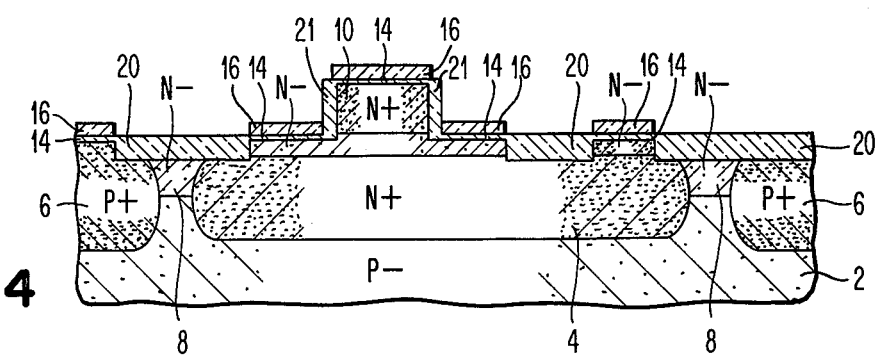

Photoresist and etching techniques are utilized to etch the silicon nitride layer or the refractory metal layer 16 selectively. The technique of reactive ion etching is preferred. Retaining photoresist, the exposed silicon dioxide 14 is then etched. The exposed silicon is next etched to a depth of approximately 1400 Angstroms. The photoresist is then stripped away to result in the structure of FIG. 3. The silicon body is then subjected to a thermal oxide growing ambient of approximately 970° C in oxygen to form the silicon dioxide dielectric isolating regions 20 and also the regions 21 passivating the mesa sidewalls. These regions are in the order of 2500 Angstroms in thickness. The growth of the silicon dioxide is inhibited at the surface regions covered by silicon nitride layer 16. During the heat cycle of thermal oxidation, the N type emitter impurity gets further driven in. The result of this process is shown in FIG. 4. When a refractory metal is used in place of the silicon nitride 16, it completely oxidizes during the formation of the silicon dioxide layers 20 in the oxygen ambient. This metal oxide layer is then a replacement for the silicon nitride layer 16 in FIG. 4.

A layer of photoresist is deposited on the surface and developed into a mask (not shown). This mask is used to selectively introduce by ion implantation an N-type impurity to form the collector reach-through region 22. The N-type impurity is at a high concentration level of typically $2 \times 10^{20}$ atoms/cc at the surface of the silicon. Phosphorous is a suitable N-type impurity for this collector reach-through region 22. Using phosphorous as an impurity, a suitable ion implantation dose and energy conditions are about $2 \times 10^{15}$ cm$^{-2}$ and about 100–200 keV. The photoresist is then removed.

Figure 5:
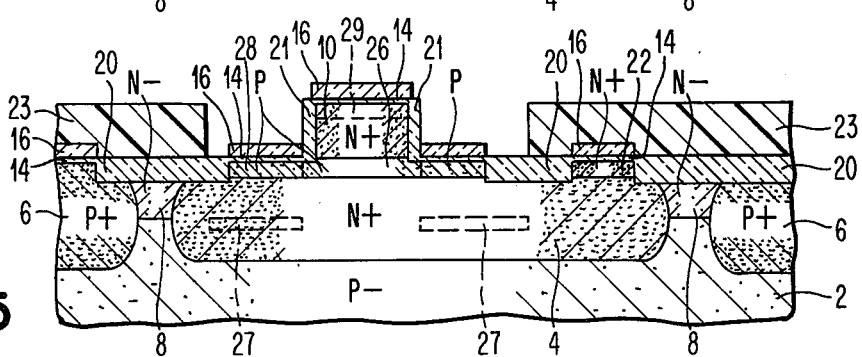

Another layer of photoresist is deposited on the surface and then made into a mask by the standard photolithography techniques. This mask is the noncritical blockout mask 23 shown in FIG. 5 that is to be used as the base ion implantation mask. Mask 23 is used for two successive ion implantations. In this example, an NPN transistor is being formed so the base dopant is to be a P type material such as boron. Using boron, the suitable dose and energy conditions for the first of the two successive ion implantations is about $1 \times 10^{14}$ ions/cm$^2$ and 30 to 80 keV; and preferably about $6 \times 10^{14}$ cm$^{-2}$ and about 50keV. This is considered a high dosage and low energy ion implantation with the purpose of forming the extrinsic base region 28 surrounding the emitter. The ion implantation also occurs at the surface of the emitter in region 29 but does not harm the characteristics of the emitter because the high concentration of the emitter dopant over-compensates the concentration of the ion implanted base dopant in region 29. A suitable dose and energy condition for the second ion implantation are between about $8 \times 10^{12}$ and $8 \times 10^{13}$ ions/cm$^2$ and 300 to 500 keV; and preferably about $2 \times 10^{13}$ cm$^{-2}$ and 400 keV. The second ion implantation is to produce the intrinsic base region 26. This is a substantially high energy and low dosage ion implantation. This ion implantation also deposits the base dopant in regions 27 within the sub-collector. However, the concentration of P material is relatively low in comparison to the high N+ sub-collector region 4 so that it is completely over-compensated by the N+ material. The sub-collector 4 is therefore not adversely affected by the P dopant in regions 27.

The photoresist mask 23 is removed. The structure is annealed at an elevated temperature of about 900° C and for about 30 minutes to cure the damage created during the ion implantation steps.

Figure 6:
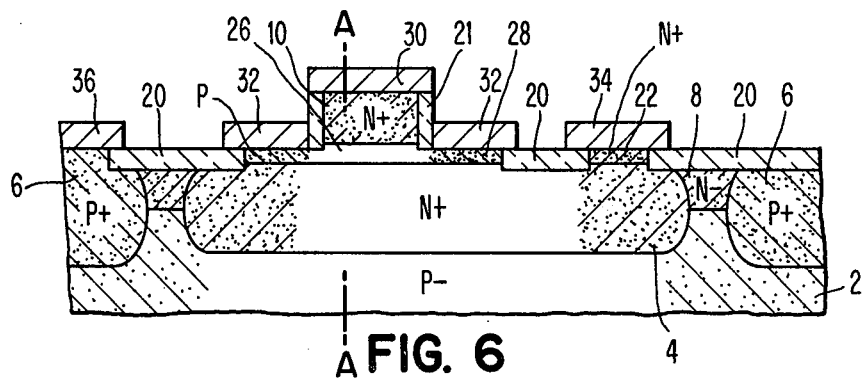

Standard photolithography and etching techniques are used to selectively etch through, for example, by the reactive ion etching technique, the silicon nitride or metal oxide layer 16, and the silicon dioxide layer 14. The purpose of etching the insulating films 16 and 14 selectively and not in a blanket manner is to be able to obtain an insulation over the P type resistors which are normally made simultaneously with the transistor base regions. A blanket metallization film (not shown) of between about 5,000 to 7000 Angstroms in thickness is deposited over the entire surface of the silicon body. The metallization is, for example, aluminum or aluminum-copper alloy. The thickness of the film is critical in the sense that it should be less than the height of the silicon emitter mesas, which in our example was approximately 8,000 Angstroms. This will provide the desired discontinuity of the metallization film at the mesa sidewalls. Again using the standard photolithography techniques wherein a photoresist layer is used as a mask, the first level metallization pattern in the blanket metallization film is made. The metallization is then sintered for about 30 minutes at 400° C. The resulting structure is shown in FIG. 6 wherein the metal contact to emitter is 30, the metal contact to the extrinsic base region is 32, the metal contact 34 to the collector is on the collector reach-through region 22, and the metal contact 36 to the substrate is on the outdiffused isolation region 6.

The subsequent passivation and other levels of metallization to complete the semiconductor integrated circuit are not shown. However, typically approximately 7000 A of a passivating material such as silicon dioxide laid down preferably by cathodic sputtering, or alternatively an organic material such as a polyimide is deposited over the surface of the FIG. 6 device. The preferred deposition process for silicon dioxide is described in J. S. Lechaton et al. U.S. Pat. No. 3,804,738 issued Apr. 16, 1974 and R. P. Auyang et al. U.S. Pat. No. 3,983,022 which are assigned to the same assignee as the present patent application. The preferred deposition process for polyimide is as described in the article "Invited: A Novel Planar Multilevel Interconnection Technology Utilizing Polyimide," by Seiki Harada et al., published in Proceedings of the 6th Conference on Solid State Devices, Tokyo, 1974; Supplement to the Journal of the Japanese Society of Applied Physics, Vol. 44, 1975.

Standard photolithography techniques are used to form a photoresist layer which acts as a mask to etch holes in the passivation film down to the first level metallurgy and to a portion of the top surface of the silicon emitter mesa. Alternatively, standard photolithography techniques are used to form a photoresist layer which acts as a mask to etch holes in the passivation film down to the first level metallurgy and then a blanket partial etch-back of the passivation film is done to uncover the entire top surface of the silicon emitter mesa. The second level metallurgy is typically a deposition of approximately 1.5 micrometers in thickness. This film also is preferably aluminum or aluminum copper alloy. Photolithography techniques are used to mask and then etch the metallization into the desired electrical patterns. The device is now ready for wafer processing which involves the final passivation layer, dicing and mounting the semiconductor chips on a suitable carrier or substrate.

Figure 7:
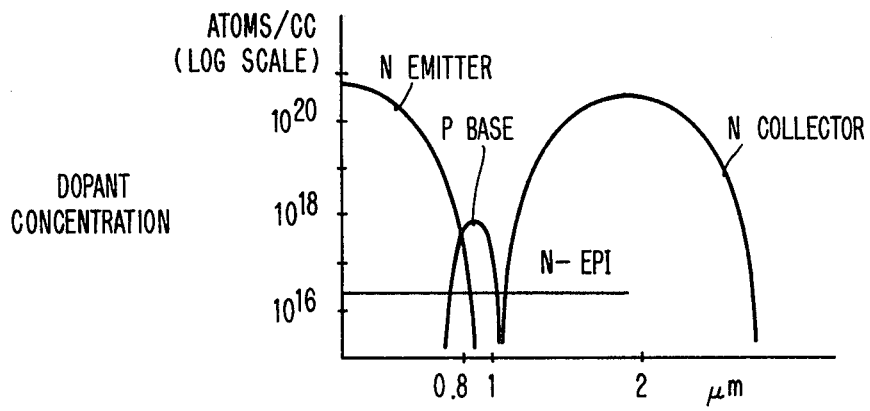
FIG. 7 illustrates the impurity concentration profile at the cross-section A—A of the bipolar transistor (FIG. 6) fabricated through the process described in FIGS. 1-6.

The concentration profile at the cross section A—A of the bipolar transistor (FIG. 6) fabricated through the sequential process described in FIGS. 1 through 6 is given in FIG. 7. The horizontal axis in FIG. 7 shows the distance in micrometers from the silicon surface at the emitter mesa into the silicon body. The vertical axis shows the concentration in atoms/cc of the emitter, base and collector dopants of N, P and N type, respectively. By design, the depth of the final emitter-base junction from the silicon surface of the mesa is about 500 A less than the height of the silicon mesa. This insures that the emitter diffusion is not electrically shorted to the base contact metal.

Figure 9:
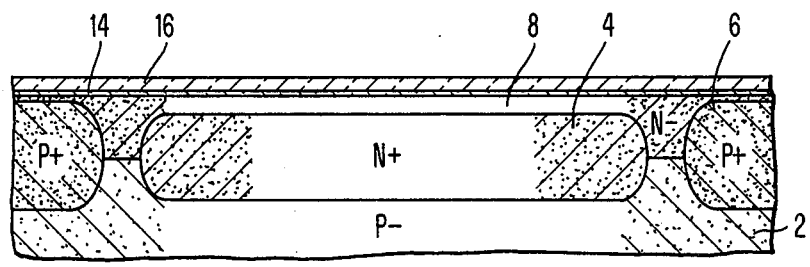
FIGS. 9 and 10 illustrate another method for forming the mesa structure of the present invention.
Figure 10:
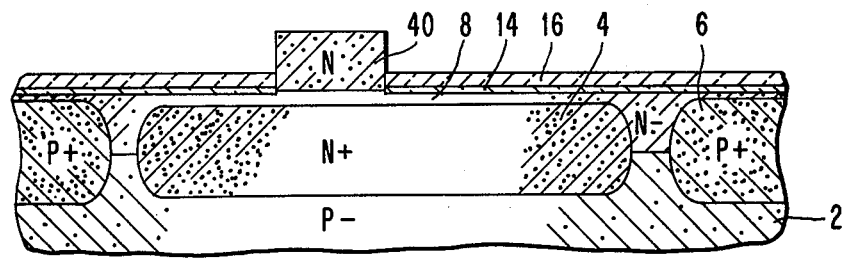

A second embodiment for forming the emitter mesa may be more fully understood with reference to FIGS. 9 and 10. The process of the second embodiment is identical to the first through the epitaxial growth of monocrystalline N-type silicon 8 except that the thickness of the epitaxial layer is about 8000 Angstroms less than in the first embodiment. Silicon dioxide and silicon nitride layers 14 and 16, respectively, are then deposited as shown in FIG. 9. Openings are made in the silicon dioxide and silicon nitride layers where the emitter mesas are desired. A localized epitaxial growth technique is next used such as described in the chapter "Selective Epitaxy of Silicon Under Quasi-Equilibrium Conditions" by Erhard Sirth and Hartmut Seiter in *Semiconductor Silicon*, book edited by R. R. Heberecht and E. L. Kern, published (1969) by Electronics Division and Electromechanics and Metallurgy Division of the Electrochemical Society, New York, N.Y.

The process involves epitaxial growth on exposed silicon surface and inhibition of nucleation on the amorphous masking layer by keeping low the supersation of the vapor phase with silicon in the reaction zone. The epitaxial growth forms a monocrystalline silicon mesa 40 which is preferably about 8000 A in thickness and between about 5000 to 12000 A. During the latter part of the epitaxial growth process, an N type impurity of relatively high concentration is introduced into the growth ambient. The presence of this N type impurity in high concentration produces the resulting high concentration N epitaxial emitter mesa 40 which is shown in FIG. 10. At this point the silicon nitride layer 16 and the silicon dioxide layer 14 are selectively etched, followed by etching of exposed silicon to a depth of approximately 1400 Angstroms. The structure is then subjected to thermal oxidation so as to result in a structure similar to FIG. 4 except that the thermal silicon dioxide also grows on the exposed top of the silicon mesa. The portion of thermal silicon dioxide grown on the top of the silicon mesa is preferably removed at this stage using mechanical polishing. Alternatively, if polyimide is used later as a passivation film above first level metallization, then a chemical dip etch may be preferably used to remove the exposed thermal silicon dioxide on top of the silicon mesa. The remaining process of the second embodiment is essentially the same as the first embodiment starting from ion implantation of collector reach-through.

Figure 11:
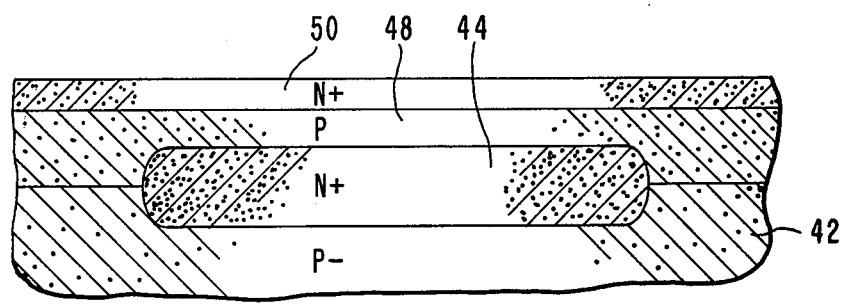
FIGS. 11-13 illustrate still another method for forming the bipolar semiconductor device of the present invention.
Figure 12:
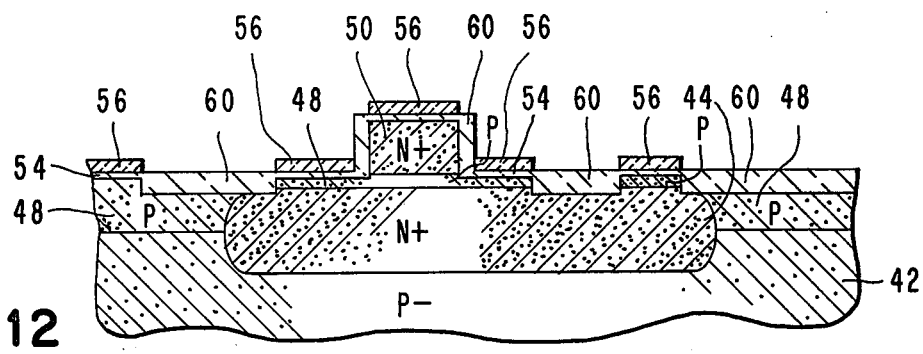
Figure 13:
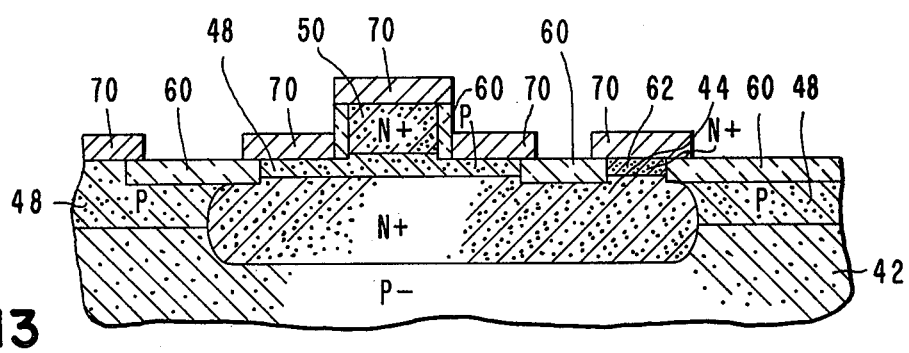

The two embodiments described above consist of the preferred base formation through two-stage ion implantation subsequent to emitter mesa formation. A third embodiment essentially consists of base formation through epitaxial monocrystalline silicon growth prior to emitter mesa formation through either method of the first two embodiments. The third embodiment may be more fully understood with reference to FIGS. 11-13. The process of the third embodiment is briefly as follows: A high concentration N+ type collector region 44 is formed in a P− type substrate 42. A P type epitaxial film 44 of monocrystalline silicon is grown on the top surface of the silicon substrate after removal of all masking material. The concentration of the P type dopant of the epitaxial film is in the approximate range of $10^{17}$–$10^{18}$ atoms/cc. The thickness of the P type epitaxial film is typically about 2 micrometers if the N type emitter mesa is subsequently formed in the manner of the first embodiment described above. The thickness of the P type epitaxial film is typically about 1.2 micrometers if the N type emitter mesa is subsequently formed through localized epitaxial growth in the manner of the second embodiment. Continuing with the analog of the first embodiment, an N type blanket diffusion 50 is obtained in the P type epitaxial film as shown in FIG. 11. This is followed by mesa formation through reactive ion etching, growth of a thin silicon dioxide layer 54 and deposition of the silicon nitride or refractory metal layer 56. The layers 54 and 56 are next selectively etched, the exposed silicon is etched to an approximate depth of 1400 Angstroms and thermal silicon dioxide 60 is grown as shown in FIG. 12. N+ type collector reach-through region 62 is then formed, followed by selective etching of silicon dioxide and silicon nitride layers 54 and 56. A first level metallization film 70 of about 5000-7000 Angstroms thickness is then deposited and etched to result in the structure of FIG. 13. The remaining wafer processing is similar to the processing of the first embodiment described above.

The typical height of the silicon mesa is in the range of 5000-12000 A. The height is large enough to obtain the desired discontinuity at the mesa sidewalls of silicon nitride layer 16 or its alternative such as a refractory metal and also of the first level metal layer 29. The thickness of the silicon nitride layer 16 or its alternative is typically six to eight times smaller than the height of the silicon mesa. The thickness of the first level metal 29 is typically 1.5 to 2 times smaller than the height of the silicon mesa.

The large height of the emitter mesa, which is in the range of about 5000-12000 A is also advantageous for improved electrical characteristic of the transistor. The large height provides improved emitter efficiency and hence improved current gain without sacrificing other electrical characteristics of the transistor. Above about 12000 A the surface becomes too nonplanar.

The preferred thickness of the silicon dioxide 21 surrounding the silicon mesa is in the range of 1000-4000 Angstroms and preferably about 2000 Angstroms. This small thickness facilitates locating the base contact metal 32 only 1000-4000 A away from the edge of the intrinsic base region 26. This virtually eliminates the relatively large extrinsic base resistance normally present in the transistor structures of the prior art. It is preferred to obtain the thickness of the silicon dioxide 21 of about 2000 Angstroms since portions of silicon dioxide grown at that process step are also used for completely flanking the base region, the typical width of the base region being 1500-2000 Angstroms. The lower limit of about 1000 Angstroms on the thickness of the silicon dioxide 21 is set by practical limitations of the processing state-of-the-art. Pinhole formation may be a problem for silicon dioxide thickness less than about 1000 Angstroms unless great precautions are taken to prevent pinholes.

While the invention has been particularly shown and described with reference to the embodiments thereof, it will be understood by those skilled in the art that the foregoing and other changes in form and detail may be made without departing from the spirit and scope of the invention. For example, it is readily possible to form Schottky barrier diodes, resistors or similar devices simultaneously with the fabrication of the bipolar transistors specifically described. Furthermore, PNP transistors may be formed rather than NPN transistors by simply using the opposite conductivity dopants for substrate, collector, base and emitter regions.

What is claimed is:

1. A method for fabricating a semiconductor device comprising:
   forming a mesa emitter in a silicon body,
   passivating the said mesa emitter sidewall with a suitable dielectric;
   forming a base region in said body using a blockout mask for a first ion implanation to form an extrinsic base region in said body surrounding said mesa emitter using high dose and low energy and a second ion implantation to form an intrinsic base region in said body below said mesa emitter and contiguous with said extrinsic base region using a low dose and high energy; and
   providing contacts to said emitter and said extrinsic base region.

2. The method of claim 1 wherein said mesa emitter is formed by reactive ion etching away portions of the silicon surface.

3. The method of claim 2 wherein said mesa emitter is formed so as to taper from the widest at the surface to the narrowest at the bottom.

4. The method of claim 1 wherein said mesa emitter is formed by epitaxially growing monocrystalline silicon from the surface of the said silicon body.

5. The method of claim 1 wherein the resulting emitter-base junction is substantially in one plane and, substantially without sidewall component.

6. The method of claim 1 wherein the depth of the emitter base junction from the silicon surface of the said emitter mesa is about 500 Angstroms less than the height of the silicon mesa.

7. The method of claim 1 wherein said base contact is formed at least substantially surrounding said emitter mesa.

8. The method of claim 1 wherein silicon nitride is formed upon the top surface of said emitter mesa and the top surfaces of said silicon body leaving the sides of said emitter mesa without silicon nitride.

9. The method of claim 8 wherein the said silicon nitride is formed by a sputtering deposition process.

10. The method of claim 1 wherein a refractory metal is deposited upon the top surface of said emitter mesa and the top surfaces of said silicon body leaving the sides of said emitter mesa without the refractory metal.

11. The method of claim 8 wherein the silicon body is thereafter subjected to a thermal oxidation ambient to form a silicon dioxide passivation layer on the sides of said emitter mesa.

12. The method of claim 10 wherein the refractory metal oxidizes in the high temperature oxygen ambient during a subsequent thermal oxidation step.

13. The method of claim 1 wherein said silicon body contains subcollector regions under the said mesa emitter and said base region and the said second ion implantation is additionally made in a portion of said subcollector regions.

14. The method of claim 1 wherein said first ion implantation is additionally made in said mesa emitter.

15. The method of claim 1 wherein the said first ion implantation has a dose of between about $1 \times 10^{14}$ to $8 \times 10^{14}$ ions/cm$^2$ and an energy of between about 30 to 80 keV and said second ion implantation has a dose of between about $8 \times 10^{12}$ to $8 \times 10^{13}$ ions/cm$^2$ and an energy of between about 300 to 500 keV.

16. The method to claim 1 wherein the said emitter mesa is between about 5000 to 12000 A in height.

17. The method of claim 1 wherein the distance from the edge of the base contact to the edge of the intrinsic base region is less than 4000 A.

18. The method of claim 1 wherein transistors in said semiconductor device are electrically isolated from one another by dielectric isolation.

19. The method of claim 18 wherein the base-collector junction is substantially in one plane.

20. The method of claim 11 wherein the thermal oxidation ambient to form a silicon dioxide passivation layer on the sides of said emitter mesa is also used to form the dielectric isolation for electrically separating transistors in semiconductor device from one another.

21. A method for fabricating a semiconductor device comprising:
    forming by epitaxial growth a region which will subsequently be designated as the base region;
    forming a mesa emitter on said region designated as the base region;
    said mesa emitter region being of opposite conductivity type than said base region;
    passivating the said emitter sidewall with a suitable dielectric;
    electrically separating regions of said region designated as the base region by use of dielectric isolation formation to produce base regions under and surrounding said mesa emitter; and
    providing contacts to said emitter and base regions.

22. The method of claim 21 wherein said mesa emitter is formed by reactive ion etching away portions of the silicon surface.

23. The method of claim 22 wherein said mesa emitter is formed so as to taper from the widest at the surface to the narrowest at the bottom.

24. The method of claim 21 wherein said mesa emitter is formed by epitaxially growing monocrystalline silicon from the surface of the said silicon body.

25. The method of claim 21 wherein the said emitter mesa is between about 5000 to 12,000 A in height.

26. The method of claim 21 wherein the distance from the edge of the base contact to the edge of the intrinsic base region is less than 4000 A.

* * * * *